US011502200B2

(12) United States Patent
Gu et al.

(10) Patent No.: US 11,502,200 B2
(45) Date of Patent: Nov. 15, 2022

(54) TRANSISTOR DEVICE HAVING SIDEWALL SPACERS CONTACTING LOWER SURFACES OF AN EPITAXIAL SEMICONDUCTOR MATERIAL

(71) Applicant: GLOBALFOUNDRIES U.S. Inc., Santa Clara, CA (US)

(72) Inventors: Sipeng Gu, Clifton Park, NY (US); Judson R. Holt, Ballston Lake, NY (US); Haiting Wang, Clifton Park, NY (US); Yanping Shen, Saratoga Springs, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/906,490

(22) Filed: Jun. 19, 2020

(65) Prior Publication Data

US 2021/0399126 A1 Dec. 23, 2021

(51) Int. Cl.
*H01L 29/78* (2006.01)
*H01L 29/08* (2006.01)
(Continued)

(52) U.S. Cl.
CPC .... *H01L 29/785* (2013.01); *H01L 21/823418* (2013.01); *H01L 21/823468* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696;
(Continued)

(56) References Cited

U.S. PATENT DOCUMENTS 9,159,630 B1 * 10/2015 Wei ................. H01L 21/823821
9,887,094 B1 2/2018 Qi et al.
(Continued)

FOREIGN PATENT DOCUMENTS

CN 111261519 * 6/2020
DE 10 2019 118 375 * 4/2020

OTHER PUBLICATIONS

Machine translation of DE 10 2019 118 375, published on Apr. 2, 2020.*

*Primary Examiner* — Younes Boulghassoul
(74) *Attorney, Agent, or Firm* — Francois Pagette; Hoffman Warnick LLC

(57) ABSTRACT

An illustrative transistor device disclosed herein includes a gate structure positioned around a portion of a fin defined in a semiconductor substrate and epitaxial semiconductor material positioned on the fin in a source/drain region of the transistor device, wherein the epitaxial semiconductor material has a plurality of lower angled surfaces. In this example, the device further includes a first sidewall spacer positioned adjacent the gate structure, wherein a first portion of the first sidewall spacer is also positioned on and in physical contact with at least a portion of the lower angled surfaces of the epitaxial semiconductor material.

14 Claims, 11 Drawing Sheets

100
135 136 138 134 135 133 132 120A 138 132 138 120A 114 112 1 2 118A 118A 118A 103S 120X 130 120X 130 118 118 118 116 103A 116 116 View X-X 102
136 138 135 134 133 118S 118A 118S 118A 120A 120A 118 120A 112 116 103B 114 103A 120Y 107 105 View Y-Y 102

(51) Int. Cl.
*H01L 29/06* (2006.01)
*H01L 29/66* (2006.01)
*H01L 21/8234* (2006.01)

(52) U.S. Cl.
CPC ...... *H01L 29/0653* (2013.01); *H01L 29/0847* (2013.01); *H01L 29/6656* (2013.01); *H01L 29/66553* (2013.01); *H01L 29/66636* (2013.01); *H01L 29/66795* (2013.01); *H01L 29/7848* (2013.01)

(58) Field of Classification Search
CPC ........... H01L 29/42392; H01L 29/0673; H01L 29/66439; H01L 29/775; H01L 29/0847; H01L 29/66636; H01L 29/41783; H01L 29/0653; H01L 21/823418; H01L 21/823814; H01L 29/66553; H01L 29/6656; H01L 29/6653; H01L 21/823468; H01L 21/823864; H01L 29/7848
See application file for complete search history.

(56) References Cited

U.S. PATENT DOCUMENTS

| | | | | |
|---|---|---|---|---|
| 10,269,932 | B1 | 4/2019 | Arya et al. | |
| 2016/0190251 | A1* | 6/2016 | Feng | H01L 21/823431 257/288 |
| 2019/0312117 | A1* | 10/2019 | Qi | H01L 29/665 |
| 2021/0233997 | A1* | 7/2021 | Chen | H01L 29/78696 |
| 2021/0313441 | A1* | 10/2021 | Lin | H01L 29/0653 |

* cited by examiner 100
107R
103S
103A
103S
107
102
View Y-Y
103B
105

111
111
2
1
108-2
108-1
103S
103A
102
View X-X 100
107R
118X
118
116
103A
107
102
118S
118X
118X
114
120
103R
112
103B
105
View Y-Y
118S
120
114
112
103S
111
2
108-2
118
116
116
118
103A
View X-X
111
1
108-1
116
118

100
111
120A
114
112
103S
118S
118
116
108-2
2
120X
1
108-1
103A
102
View X-X
107R
107
120Z
118X
120Y
116
103R
103B
105
View Y-Y 100
View X-X
View Y-Y
111
120A
114
112
118AX
118Y
114X
118S
120B
120X
108-1
108-2
103S
103A
118A
118
116
102
118Z
107R
107
103B
105
121
120Y

GW
X
108-2
112
114
120A
2
GL
Y
Y
Z
Z
1
103B
100
108-1
103A

X 100
135
136
138
134
135
133
132
120A
114
112
1
2
118A
118S
103S
120X
130
118
116
103A
View X-X
102
View Y-Y
105
107
120Y
103B
133
134

TRANSISTOR DEVICE HAVING SIDEWALL SPACERS CONTACTING LOWER SURFACES OF AN EPITAXIAL SEMICONDUCTOR MATERIAL

BACKGROUND OF THE INVENTION

Field of the Invention

The present disclosure generally relates to the fabrication of integrated circuits, and, more particularly, to various novel methods of protecting semiconductor materials in the active region of a transistor device and various novel embodiments of the resulting transistor device.

Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region of the device.

In contrast to a planar FET, which, as the name implies, is a generally planar structure, a so-called FinFET device has a three-dimensional (3D) structure that includes one or more fins that are formed in an active region of a semiconductor substrate that is bounded by an isolation structure. The portions of the fins covered by the gate structure is the channel region of the FinFET device.

To improve the operating speed of FinFET devices, and to increase the density of FinFET devices on an integrated circuit device, device designers have greatly reduced the physical size of FinFET devices over the years, particularly the channel length of transistor devices. As it relates to FinFET devices, advanced technology nodes require that the fins be formed with an ever-decreasing fin pitch.

At some point during the process of manufacturing the epitaxially grown semiconductor material is grown on the portions of the fins in the source/drain regions of the device. In one prior art technique, epi cavities are formed in the fin and thereafter, epi semiconductor material is grown in and above the epi cavities in the fins. Typically, due to the crystallographic orientation of the semiconductor material of the fins, the epi material have a somewhat diamond-shaped or mushroom-shaped configuration when viewed in a cross-section taken through the epi material in a direction corresponding to the gate width direction of the device. Maintaining the volume of epi material that is formed on the fins as well as the physical integrity of the fins and of the epi material during subsequent manufacturing operations is important to the operational characteristics of the final transistor device.

The present disclosure is directed to various novel methods of protecting semiconductor materials in the active region of a transistor device and various novel embodiments of the resulting transistor device.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of protecting semiconductor materials in the active region of a transistor device and various novel embodiments of the resulting transistor device. One illustrative transistor device disclosed herein includes a gate structure positioned around a portion of a fin defined in a semiconductor substrate and epitaxial semiconductor material positioned on the fin in a source/drain region of the transistor device, wherein the epitaxial semiconductor material has a plurality of lower angled surfaces. In this example, the device further includes a first sidewall spacer positioned adjacent the gate structure, wherein a first portion of the first sidewall spacer is also positioned on and in physical contact with at least a portion of the lower angled surfaces of the epitaxial semiconductor material.

Another illustrative transistor device disclosed herein includes a gate structure positioned around a portion of a fin defined in a semiconductor substrate, wherein, at a location under the gate structure, the fin has a fin upper surface positioned at a first level and epitaxial semiconductor material positioned on the fin in a source/drain region of the transistor device, wherein a first portion of the epitaxial semiconductor material is positioned above a level that corresponds to the first level and wherein the first portion of the epitaxial semiconductor material has a plurality of lower surfaces. In this example, the device further includes a first sidewall spacer positioned adjacent the gate structure, wherein a first portion of the first sidewall spacer is also positioned on and in physical contact with at least a portion of the plurality of lower surfaces of the first portion of the epitaxial semiconductor material.

One illustrative method disclosed herein includes forming a gate structure around a portion of a fin and performing a first epitaxial growth process to form a first portion of epitaxial semiconductor material on the fin in a source/drain region of the transistor, wherein the first portion of epitaxial semiconductor material has a plurality of lower surfaces. In this example, the method also includes forming a first sidewall spacer adjacent the gate structure, wherein a first portion of the first sidewall spacer is formed on and in physical contact with at least a portion of the lower surfaces of the first portion of epitaxial semiconductor material, and performing a second epitaxial growth process to form a second portion of epitaxial semiconductor material on the first portion of epitaxial semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1:
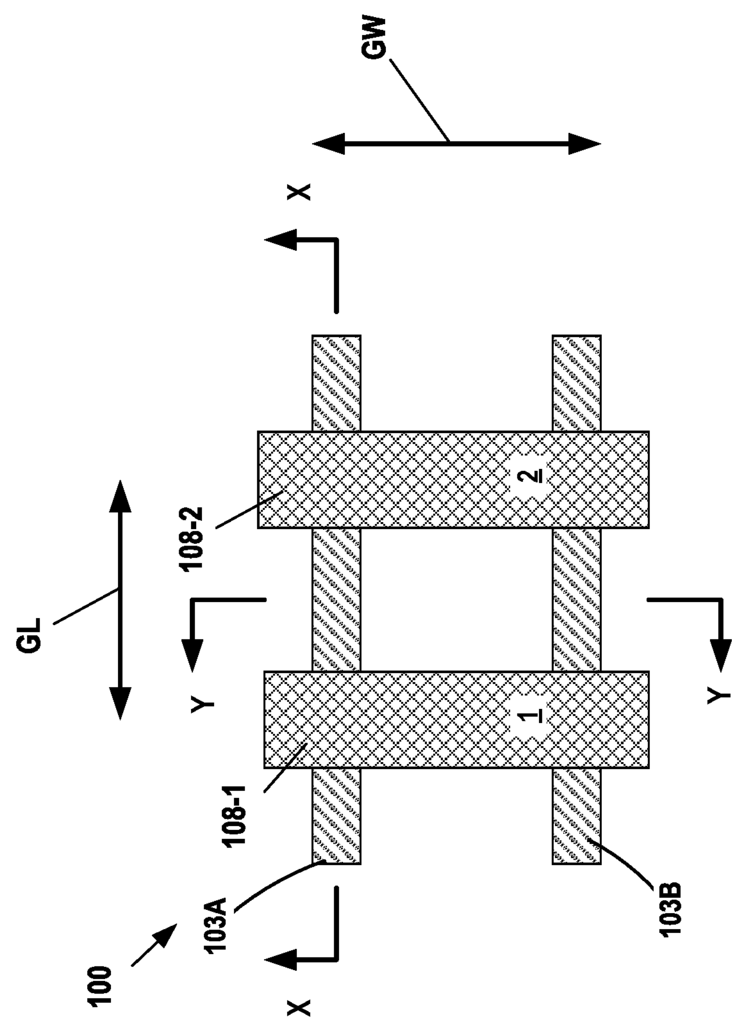
FIGS. 1-11 depict various novel methods of protecting semiconductor materials in the active region of a transistor device and various novel embodiments of the resulting transistor device. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. As will be appreciated by those skilled in the art after a complete reading of the present application, various doped regions, e.g., source/drain regions, halo implant regions, well regions and the like, are not depicted in the attached drawings. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the various embodiments of the FinFET device disclosed herein may be incorporated into any type of integrated circuit product, and it may be part of any type of circuit, e.g., memory circuits, logic circuits, etc. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-11 depict various novel methods of protecting semiconductor materials in the active region of a FinFET transistor device and various novel embodiments of the resulting FinFET transistor device. FIG. 1 is a simplistic plan view of one illustrative embodiment of an IC product 100 comprised of at least one FinFET device that may be formed using the methods described herein. As will be appreciated by those skilled in the art after a complete reading of the present application, the FinFET device may be either an N-type device or a P-type device. The IC product 100 comprises a plurality of fins 103A, 103B (collectively referenced using the numeral 103) and a plurality of sacrificial gate structures 108-1, 108-2 (collectively referenced using the numeral 108). The sacrificial gate structures 108 have also been labeled as gates 1 and 2 for reference purposes. Various cross-sectional views of the product 100 (views "X-X" and "Y-Y") depicted herein are taken where indicated in FIG. 1. More specifically, the view X-X is a cross-sectional view taken through the fin 103A and the gate structures 108 in a gate length (GL) direction of the device, while the view Y-Y is a cross-sectional view taken through the source/drain region of the device in a gate width (GW) direction of the device.

Figure 2:
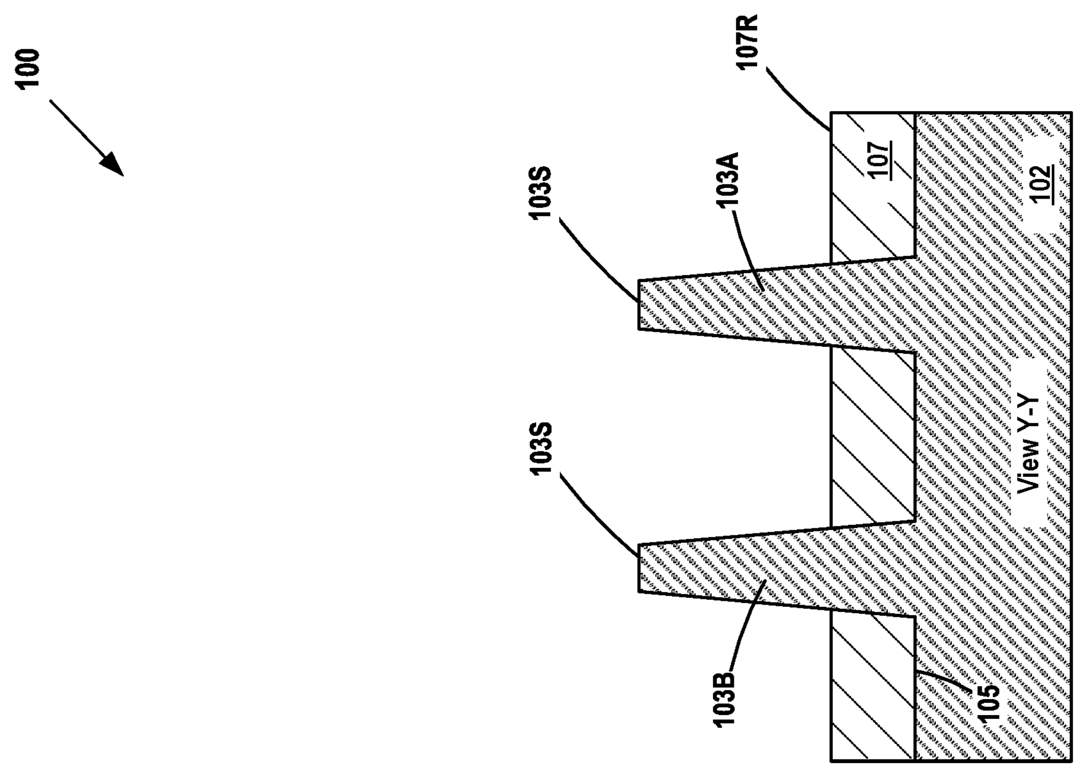
Figure 2:
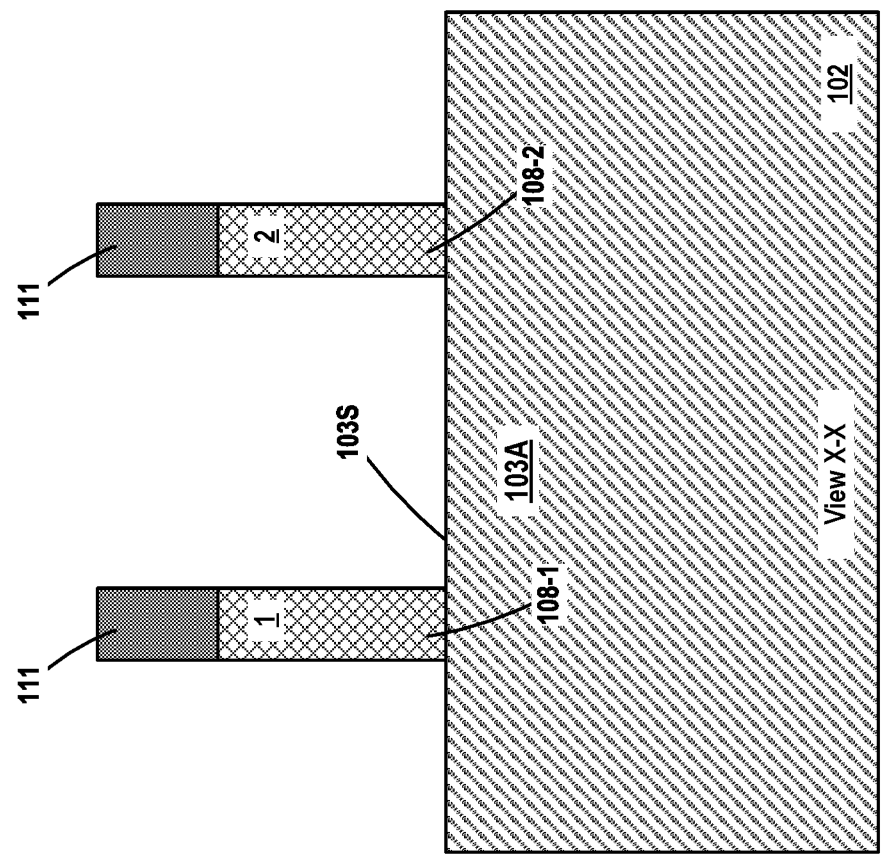

The IC product 100 will be formed on and above a semiconductor substrate 102 (see FIG. 2). The semiconductor substrate 102 may have a variety of configurations, such as a bulk silicon configuration. The substrate 102 may also have a semiconductor-on-insulator (SOI) configuration that includes a base semiconductor layer, a buried insulation layer and an active semiconductor layer positioned above the buried insulation layer, wherein transistor devices (not shown) that are formed on the substrate 102 are formed in and above the active semiconductor layer. The substrate 102 may be made of silicon or it may be made of semiconductor materials other than silicon. Thus, the terms "substrate" or "semiconductor substrate" should be understood to cover all semiconductor materials and all forms of such semiconductor materials.

FIG. 2 depicts the IC product 100 after several process operations were performed. First, the fins 103 were formed by performing one or more etching processes, e.g., anisotropic etching processes, through a patterned fin-formation etch mask (not shown) to form a plurality of fin-formation trenches 105 in the substrate 102 and thereby form the plurality of fins 103. The fins 103 have an upper surface 103S. The width and height of the fins 103 may vary depending upon the particular application. Additionally, the overall size, shape and configuration of the fin-formation trenches 105 and fins 103 may vary depending on the particular application. Next, a recessed layer of insulating material 107 (e.g., silicon dioxide) with a recessed upper surface 107R was formed between the fins 103 by performing traditional manufacturing techniques, e.g., by depositing the insulating material and thereafter performing a recess etching process.

The final gate structures 130 for the transistor devices disclosed herein will be manufactured using one illustrative embodiment of a replacement gate (or "gate-last") manufacturing technique. Accordingly, still referencing FIG. 2, after the layer of insulating material 107 was recessed, a plurality of sacrificial (or "dummy") gate structures 108, with a sacrificial gate cap 111 (e.g., silicon nitride) positioned thereabove, were formed across the substrate 102 by performing traditional manufacturing techniques. Each of the sacrificial structures 108 comprises a sacrificial gate insulation layer (not separately shown) (e.g., silicon dioxide) and a sacrificial gate electrode material (not separately shown) (e.g., polysilicon or amorphous silicon). As is customary, the sacrificial gate structures 108 are positioned around a portion of the axial length of the fins 103.

Figure 3:
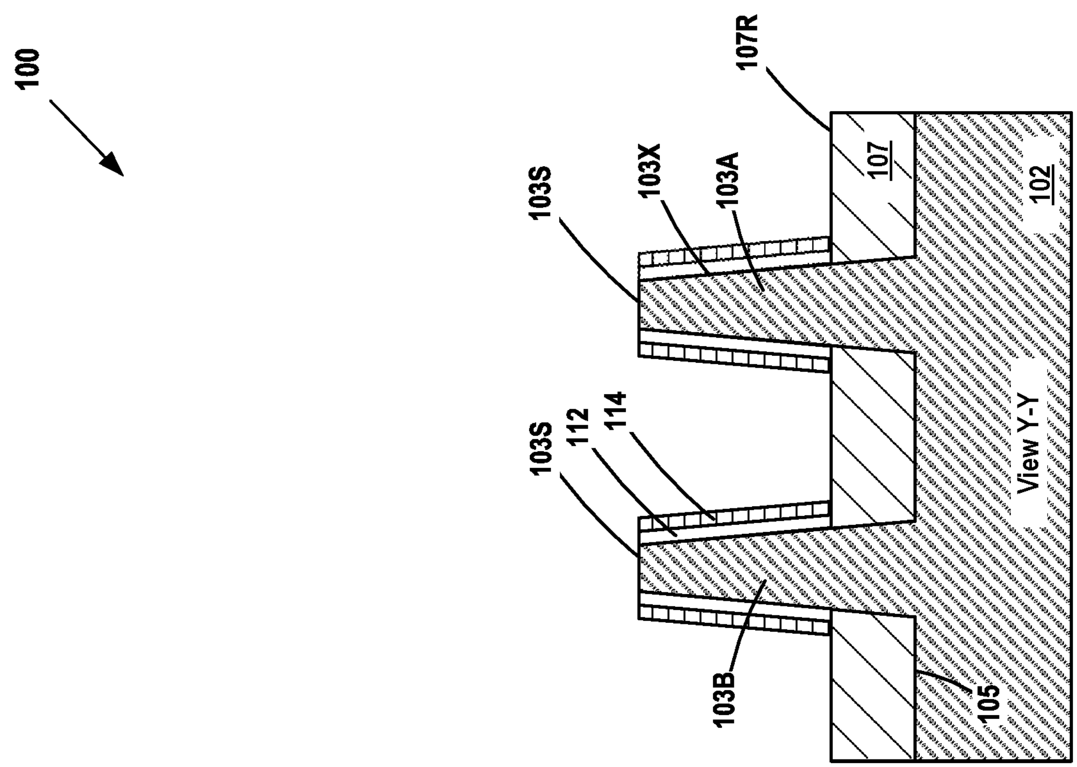
Figure 3:
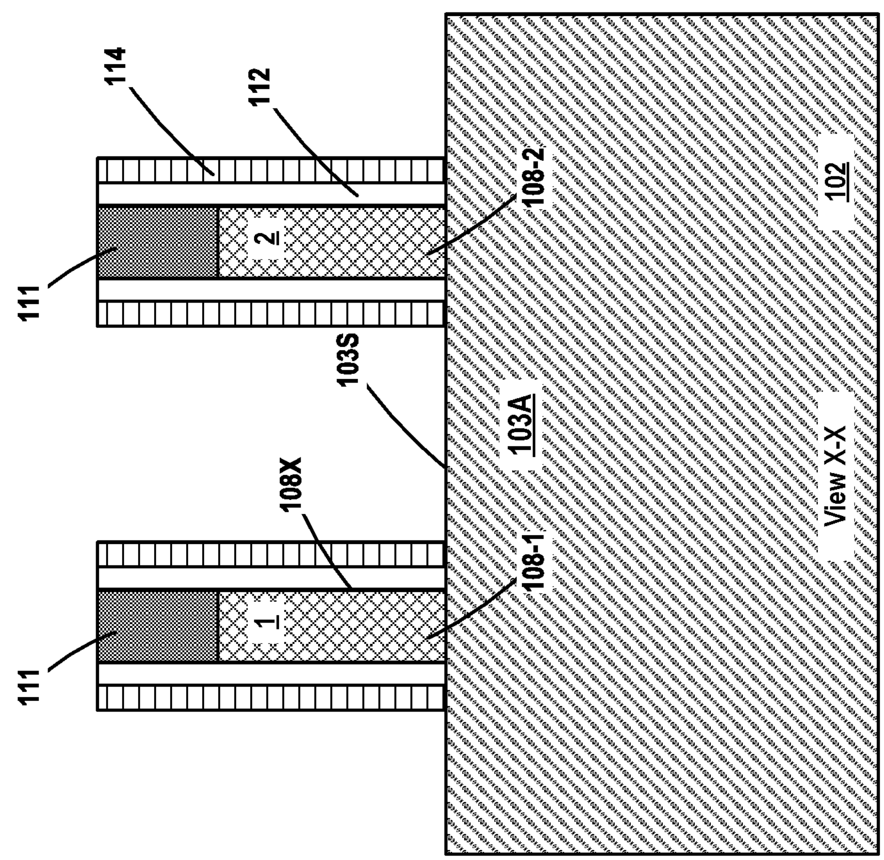

FIG. 3 depicts the IC product 100 after several process operations were performed to form a first sidewall spacer 112 and a second sidewall spacer 114 adjacent the sidewalls 108X of the sacrificial gate structures 108 and adjacent the opposing lateral sidewalls 103X of the exposed portions of the fins 103 in the source/drain regions of devices. Each of the sidewall spacers 112, 114 may be formed by depositing a conformal layer of spacer material and thereafter performing an anisotropic etching process. The sidewall spacers 112, 114 may be of any desired thickness and they may be made of any desired material. In one illustrative embodiment, the first sidewall spacer 112 may be comprised of silicon dioxide, while the second sidewall spacer 114 may be comprised of silicon nitride. In the depicted example, the first sidewall spacer 112 is positioned on and in physical contact with the sidewalls 108X, 103X, while the second sidewall spacer 114 is positioned on and in physical contact with the first sidewall spacer 112. Also note that, after completing the formation of the spacers 112, 114, the upper surface 103S of the fins 103 is exposed.

Figure 4:
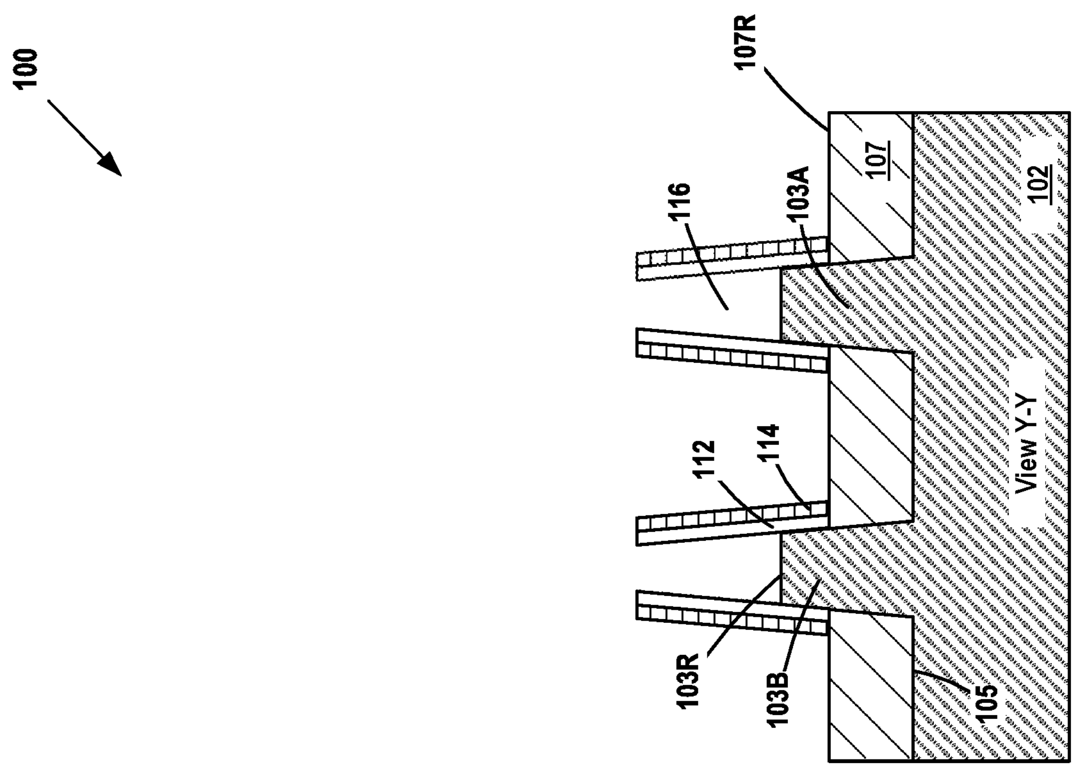
Figure 4:
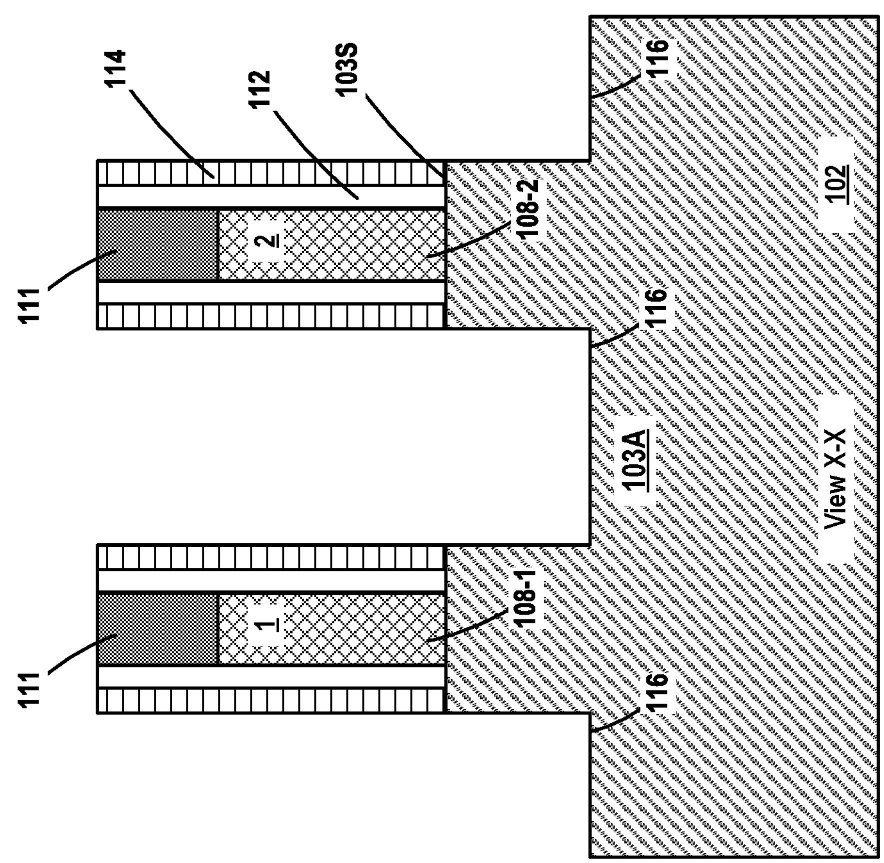

FIG. 4 depicts the IC product 100 after an etching process was performed to remove a vertical portion of the parts of the fins 103 positioned in the source/drain regions of the devices. This results in the formation of a plurality of epi cavities 116 in the fins 103. In the example shown in FIG. 4, the formation of the epi cavities 116 only involves removal of a portion of the vertical height of the fins 103 as the lowermost surface 103R of the epi cavities 116 is positioned above the recessed upper surface 107R of the layer of insulating material 107. The depth of the epi cavities 116 may vary depending upon the particular application.

Figure 5:
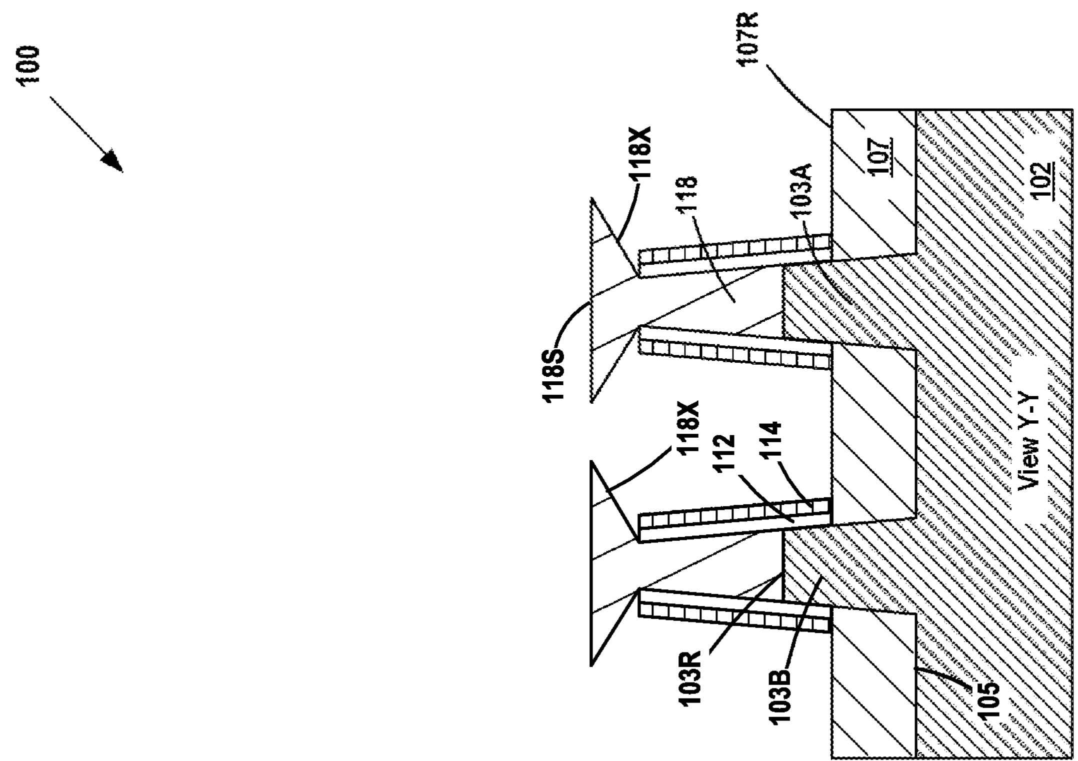
Figure 5:
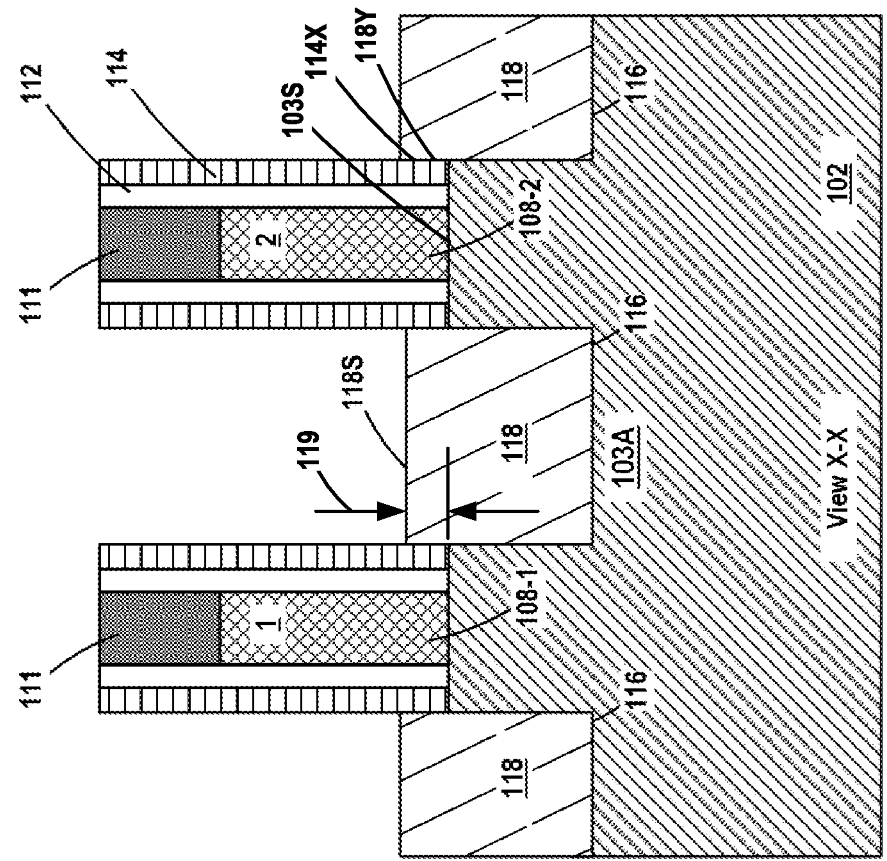

FIG. 5 depicts the product 100 after a first region of epi semiconductor material 118 was formed in the epi cavities 116 in the source/drain regions of the devices by performing a first epitaxial growth process. Due to the crystallographic orientation of the material of the substrate 102, a portion of the first region of epi semiconductor material 118 may have a partial diamond-like configuration (see view Y-Y) when viewed in a cross-section taken through the first region of epi semiconductor material 118 in a direction corresponding to the gate width (GW) direction of the devices. Note that, in the depicted example, the upper surface 118S is simplistically depicted as a substantially planar horizontally oriented surface. It should also be noted that the upper surface 118S of the first region of epi semiconductor material 118 is positioned at a level that is above the level of the original upper surface 103S of the fins 103, as reflected by the dimension 119. The magnitude of the dimension 119 may vary depending upon the particular application, e.g., 1-10 nm. The first region of epi semiconductor material 118 has an axial length that extends in the gate length direction of the transistor devices. The epi semiconductor material 118 may be formed in a doped (in situ doping) or an undoped condition. The first region of epi semiconductor material 118 may be comprised of a variety of different materials depending upon the type of devices under construction. For example, for P-type devices, the epi semiconductor material 118 may be an in-situ P-doped (e.g., boron) silicon germanium material. In the situation where the devices are N-type devices, the epi semiconductor material 118 may be an in-situ N-doped (e.g., phosphorus) silicon material. Note that, in the illustrative example depicted herein, an end surface 118Y of the first region of epi semiconductor material 118 is positioned on and physically contacts a portion of the outer surface 114X of the second sidewall spacer 114. Also note that at least a portion of the first region of epi semiconductor material 118 is positioned above a level that corresponds to the level of the original upper surface 103S of the fins 103 (as measured at a location under the gate structure 108) and that the first region of epi semiconductor material 118 comprises a plurality of lower surfaces 118X. In the illustrative example depicted herein, the lower surfaces 118X are simplistically depicted as being lower angled surfaces, but in practice the lower surfaces 118X may be of any desired configuration or shape when viewed in a cross-section like that shown in the view Y-Y.

Figure 6:
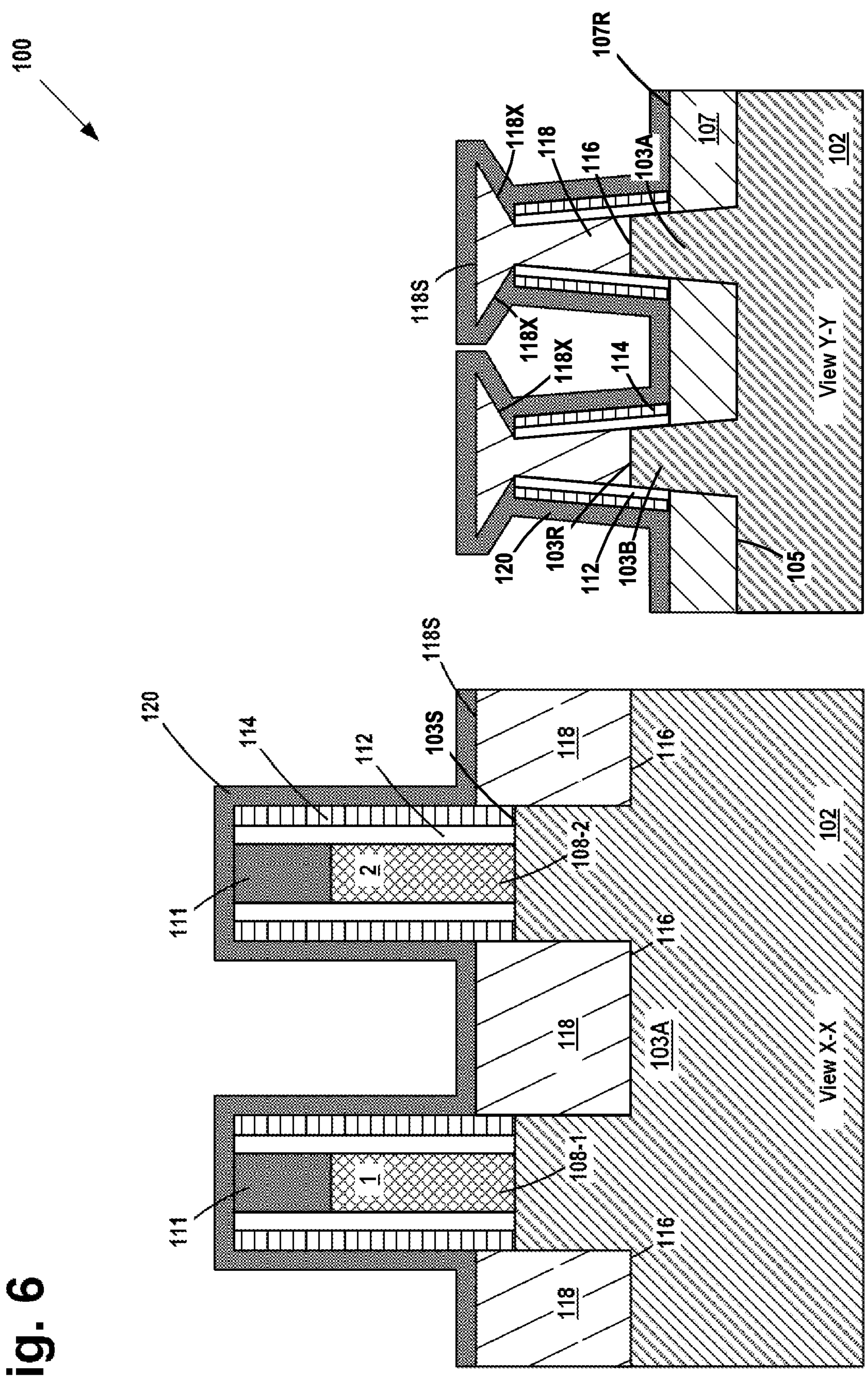

FIG. 6 depicts the IC product 100 after a conformal deposition process, e.g., a conformal ALD process, was performed to form a conformal layer of third spacer material 120 across the IC product 100. The conformal layer of third spacer material 120 may be formed to any desired thickness. The conformal layer of third spacer material 120 may be comprised of a variety of different materials, e.g., SiCN, SiOCN, SiBCN etc. Note that, in the illustrative example depicted herein, the layer of third spacer material 120 is formed on and in physical contact with the second sidewall spacer 114 and on and in physical contact with a plurality of lower surfaces 118X of the first region of epi semiconductor material 118.

Figure 7:
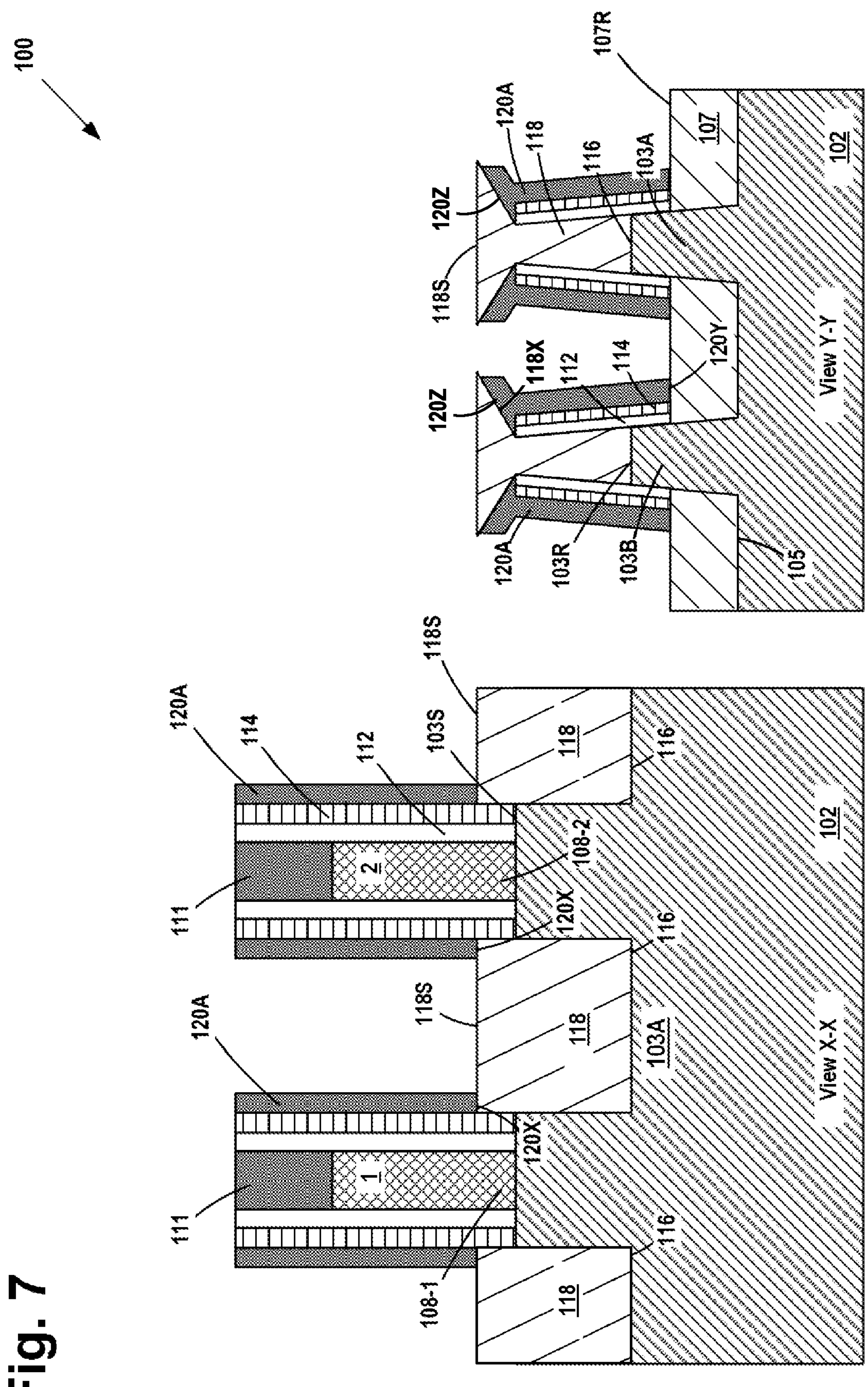

FIG. 7 depicts the IC product 100 after an anisotropic etching process was performed on the conformal layer of third spacer material 120 to define a third sidewall spacer 120A. Note that the upper surface 118S of the first region of epi semiconductor material 118 is exposed at the completion of this process. In the illustrative example depicted herein, a first portion of the third sidewall spacer 120A is positioned on and in physical contact with the lower surfaces 118X of the first region of epi semiconductor material 118. In one particular example, the lower surfaces 118X of the first region of epi semiconductor material 118 define a surface area and the first portion of the third sidewall spacer 120A may be positioned on and in physical contact with a substantial portion of the substantial entirety of the surface area defined by the lower surfaces 118X for substantially the entire axial length of the first region of epi semiconductor material 118. Also note that a second portion of the third sidewall spacer 120A is positioned on and in physical contact with the second sidewall spacer 114. Also note that, in the illustrative example depicted herein, a surface 120X (see view X-X) of the third sidewall spacer 120A is positioned on and in physical contact with a portion of the upper surface 118S of the first region of epi semiconductor material 118, a surface 120Y (see view Y-Y) is positioned on and in physical contact with the recessed upper surface 107R of the layer of insulating material 107 and a surface 120Z is positioned on and in physical contact with the lower surface 118X of the first region of epi semiconductor material 118. Lastly, the first sidewall spacer 112 and the second sidewall spacer 114 each have a surface that is positioned on and in physical contact with the recessed upper surface 107R of the layer of insulating material 107.

Figure 8:
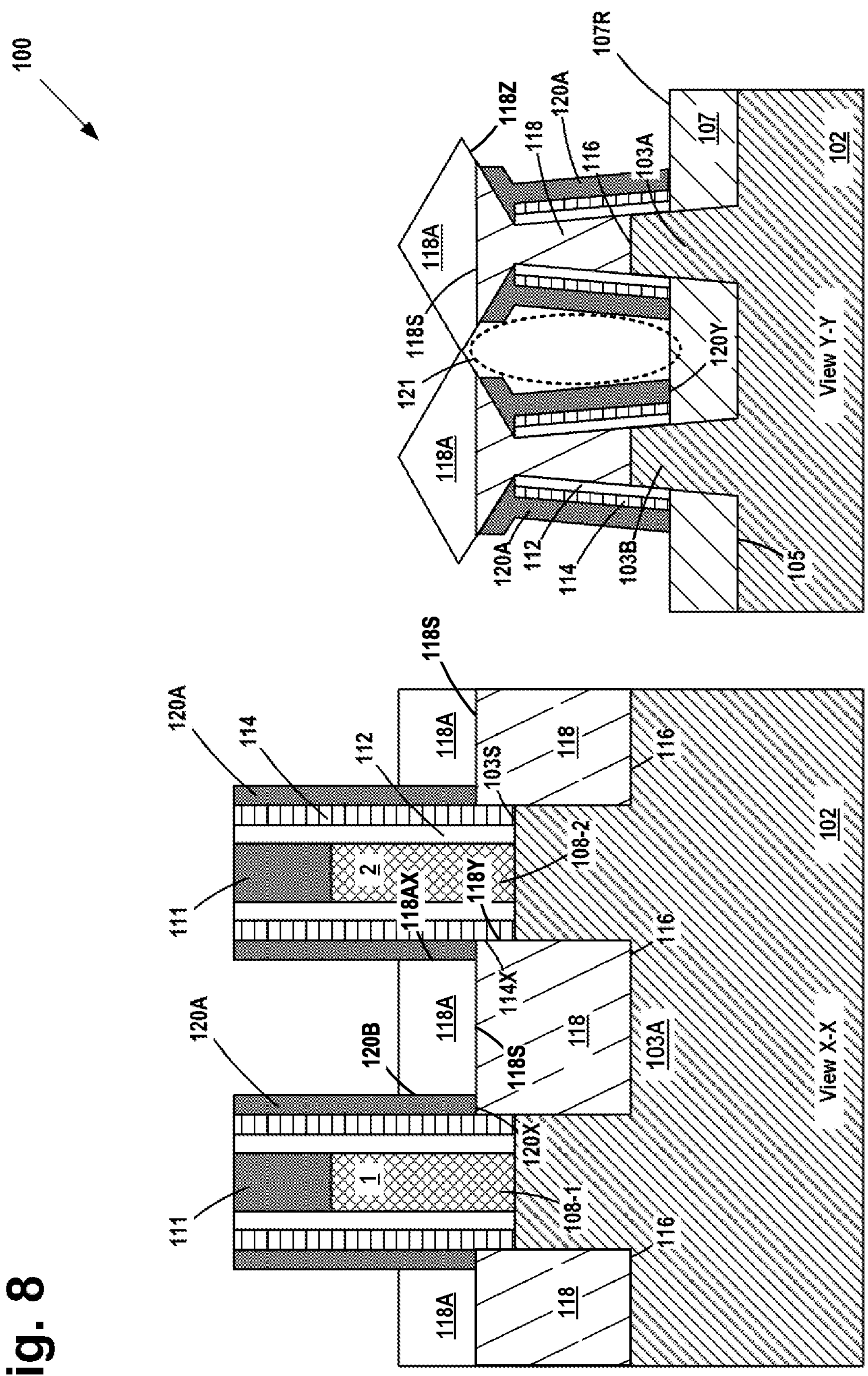

FIG. 8 depicts the IC product 100 after a second epi deposition process was performed to form a second region of epi semiconductor 118A on the first region of epi semiconductor material 118. The second region of epi semiconductor material 118A may be made of any desired semiconductor material and it may be formed in a doped (in situ doping) or an undoped condition. The first and second regions of epi semiconductor material 118, 118A may be comprised of the same epi semiconductor material, but that may not be the case in all applications. Due to the crystallographic orientation of the material of the substrate 102, the second region of epi semiconductor 118A may also have a partial diamond-like configuration (see view Y-Y) when viewed in a cross-section taken through the second region of epi semiconductor material 118A in a direction corresponding to the gate width (GW) direction of the devices. In the illustrative example depicted herein, the second regions of epi semiconductor 118A also have a plurality of lower surfaces 118Z. Note that when the lower surfaces 118X and 118Z of the first and second regions of epi semiconductor material 118, 118A, respectively, are considered collectively, they also define a surface area wherein the first portion of the third sidewall spacer 120A covers less than an entirety of the surface areas defined by the combination of the lower surfaces 118X and 118Z. The amount or volume of the second region of epi semiconductor 118A may vary depending upon the particular application. In the depicted example, the second regions of epi semiconductor material 118 are formed such that they merge or engage one another. In other applications, the second regions of epi semiconductor material 118A may not actually contact one another but there may be very little space between them.

With continued reference to FIG. 8, as will be appreciated by those skilled in the art after a complete reading of the present application, in at least some prior art process flows, at some point after the formation of the epi semiconductor material in the source/drain regions of the device—typically grown in a single continuous epi process, unlike the two step epi growth process disclosed herein—one or more layers of insulating material (not shown) are formed on the product 100 prior to the removal of the sacrificial gate structures 108 which involves, among other things, performing one or more etching processes. However, when such prior art regions of epi semiconductor material on adjacent fins were formed such that they merged with one another or were very closely spaced apart from one another, all or part of a space (generally indicated by the dashed line region 121) under the merged or closely spaced regions of prior art epi semiconductor materials between the fins may actually be a substantially empty void, free of any insulating material. On prior art devices, the void(s) present in the space 121 provided a pathway for etchants used in the process of removing the sacrificial gate structures to attack and remove at least a portion of the epi semiconductor material formed on the fins as well as at least a portion of the fins in the active region. The loss or damage to such epi semiconductor material and/or the fins on such prior art devices resulted in reduced device performance. However, as will be understood by those skilled in the art after a complete reading of the present invention, by providing the third sidewall spacer 120A on the novel FinFET device disclosed herein, the fins 103 and the epi semiconductor materials 118A, 118 in the active region are better protected from attack by the etchants used during the removal of the sacrificial gate structures 108 that may enter the space 121 between the fins 103.

Note that a surface 120B (see view X-X) of the third sidewall spacer 120A engages a side surface 118AX of the second region of epi semiconductor material 118A. Also note that, at a location above the upper surface 103S of the fins 103, the lateral width of the first region of epi semiconductor material 118 in the gate length direction of the devices is greater than the lateral width of the second region of epi semiconductor material 118A. The difference in these two dimensions of the epi materials 118A, 118 corresponds approximately to twice the thickness of the third sidewall spacer 120A in the gate length direction of the transistor devices.

Figure 9:
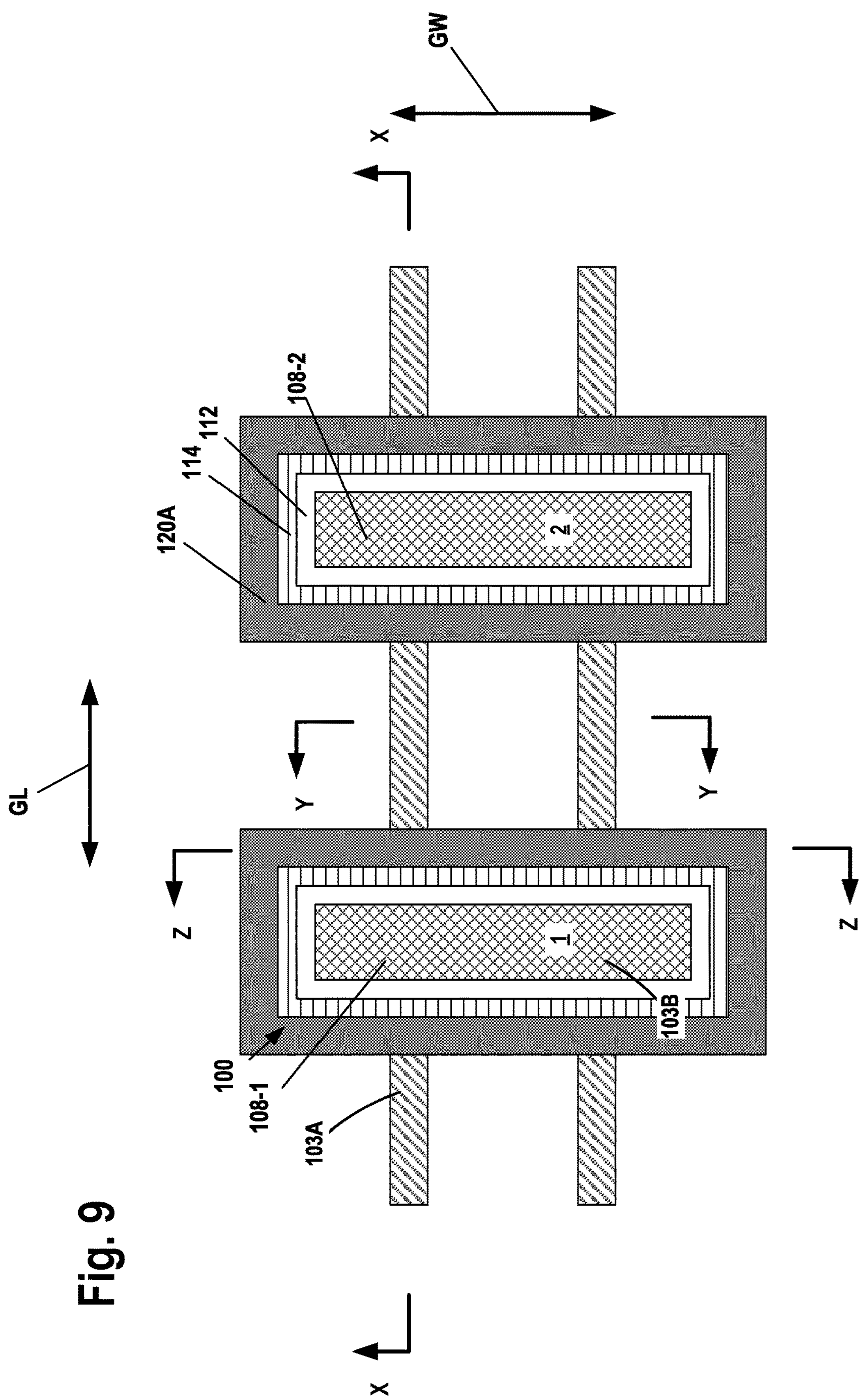
Figure 10:
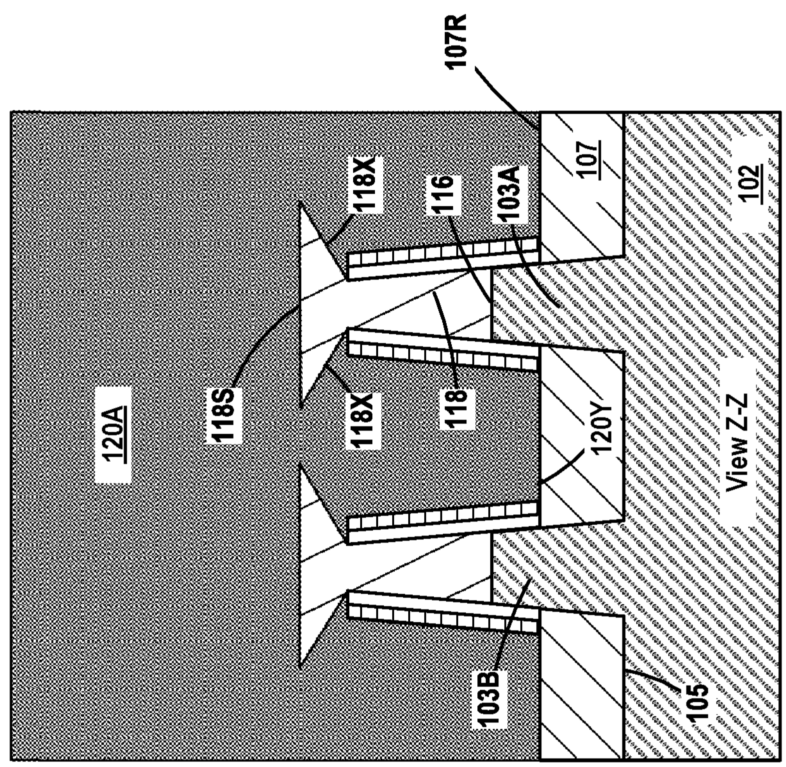

FIG. 9 is a simplistic plan view of the IC product 100. The epi materials 118, 118A and the sacrificial gate caps 111 are not depicted in FIG. 9. FIG. 9 depicts the location where a cross-sectional view Z-Z that is shown in FIG. 10 is taken. More specifically, the cross-sectional view Z-Z is taken through the third sidewall spacer 120A and the first region of epi semiconductor material 118 in a direction corresponding to the gate width direction of the devices. The second region of epi semiconductor material 118A is not shown in FIG. 10 because it was formed after the formation of the third sidewall spacer 120A. Note that, at the locations where the third sidewall spacer 120A is positioned vertically above the first region of epi semiconductor material 118, i.e., on both ends of the first region of epi semiconductor material 118, the third sidewall spacer 120A is positioned around the portion of the first region of epi semiconductor material 118 positioned above the first and second sidewall spacer 112, 114. More specifically, at the locations where the third sidewall spacer 120A is positioned vertically above the first region of epi semiconductor material 118, the third sidewall spacer 120A is positioned on and in physical contact with the upper surface 118S and the angled lower surfaces 118X of the first region of epi semiconductor material 118. Also note that the third sidewall spacer 120A is positioned on and in physical contact with the lower surfaces 118X of the first region of epi semiconductor material 118 for substantially the entire axial length of the first region of epi semiconductor material 118 in a direction corresponding to a gate length direction of the FinFET device. As noted above, the third sidewall spacer 120A provides additional protection to the integrity of the epi materials 118, 118A and the fins 103 during the process of removing the sacrificial gate structure 108. The sidewall spacer 120A also provides additional protection for the final gate structure 130 from undesirable attacks during subsequent processing operations.

Figure 11:
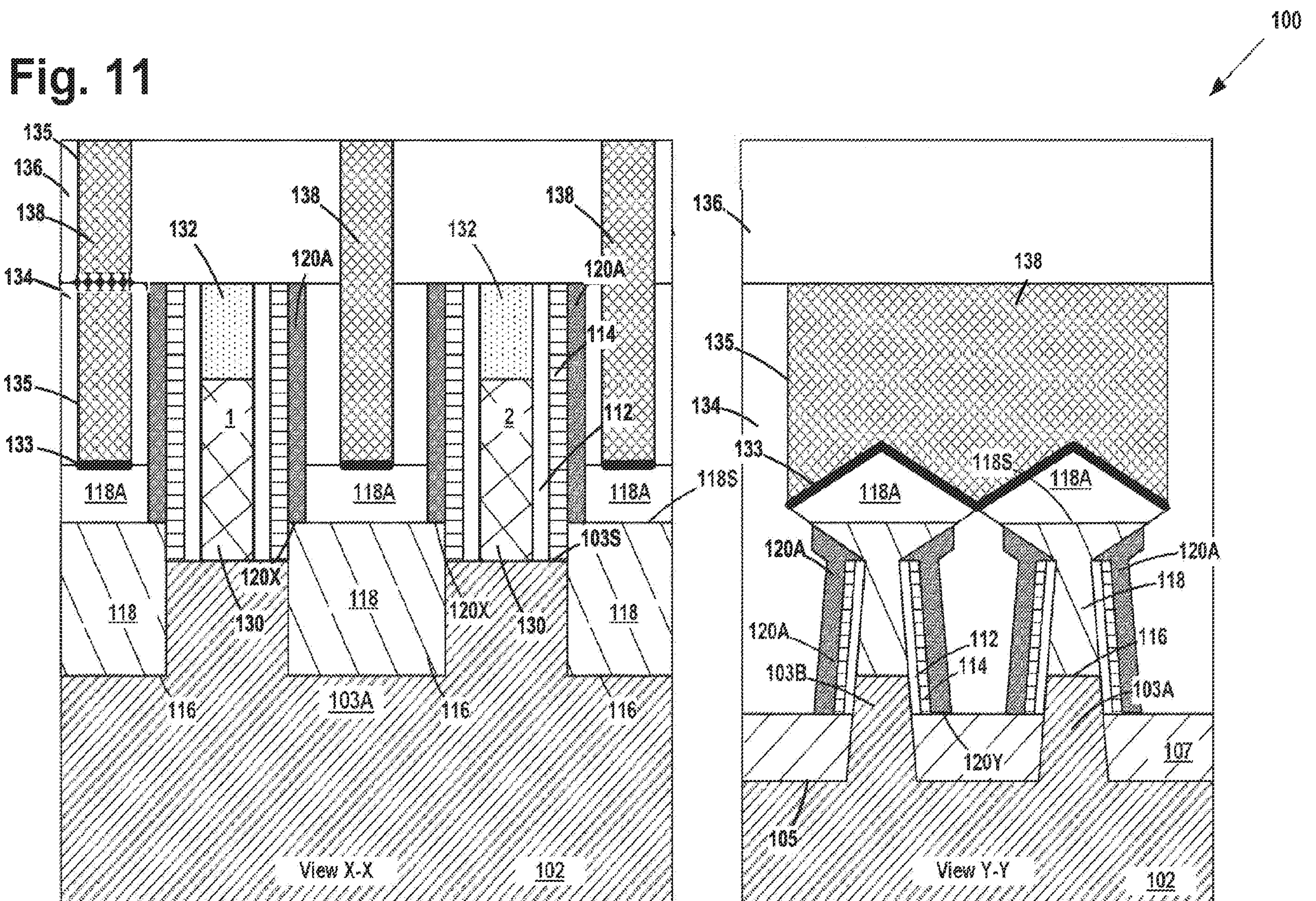

At the point of processing depicted in FIG. 10, traditional manufacturing operations may be performed to complete the fabrication of the transistor devices. Accordingly, FIG. 11 depicts the IC product 100 after several process operations were performed. More specifically, a layer of insulating material 134 was formed on the product 100. Next, the sacrificial gate caps 111 were removed by performing a chemical mechanical polishing (CMP) process so as to expose the sacrificial gate electrode portion of the sacrificial gate structures 108 for further processing. Thereafter, one or more etching processes were performed to remove the sacrificial gate structures 108, which results in the formation of a gate cavity that is laterally defined by the first sidewall spacer 112 where the final gate structure 130 for the devices will be formed. The final gate structures 130 depicted herein are intended to be representative in nature of any type of replacement gate structure that may be employed in manufacturing integrated circuit products. For example, the final gate structures 130 may comprise a high-k gate insulation layer (not separately shown), such as hafnium oxide, a material having a dielectric constant greater than 10, etc., and one or more conductive work-function adjusting metal layers (not separately shown), e.g., titanium, tantalum, titanium nitride, tantalum nitride, titanium carbide, etc., as well as one or more bulk conductive layers of material (e.g., titanium, tungsten, aluminum, etc.). Then, a CMP and/or etch-back process was performed to remove excess amounts of the materials of the final gate structures 130 that were positioned outside of the replacement gate cavities and above the layer of insulating material 134. At that point, one or more recess etching processes were performed to reduce the height or recess the materials (e.g., the high-k gate insulation layer and the conductive materials of the final gate structures 130) within the replacement gate cavities. This process operation results in the formation of a cavity above each of the recessed final gate structures 130 and between the spacers 112. The amount of recessing of the materials of the final gate structures 130 may vary depending upon the particular application. Thereafter, final gate cap structures 132 were formed in the cavities above the recessed final gate structures 130. The final gate cap structures 132 may be comprised of a material such as silicon nitride. The final gate cap structures 132 may be formed by blanket-depositing the material for the final gate cap structures 132 across the product 100 and in the cavities above the recessed final gate structures 130, and thereafter performing a CMP and/or etch-back process to remove excess amounts of the gate cap material positioned outside of the cavities using the insulating material 134 and the spacers 112 as polish-stops.

With continued reference to FIG. 11, another layer of insulating material 136 was formed above the IC product 100 and contact openings 135 were formed in the layers of insulating material 134, 136 that expose at least a portion of the second regions of epi semiconductor material 118A. At that point, a metal silicide layer 133 was formed on the exposed portions of the second regions of epi semiconductor material 118A. Next, illustrative and representative conductive structures 138, e.g., trench silicide structures, were formed in the contact openings 135 to conductively contact the epi materials 118A, 118 in the source/drain regions of the transistor devices.

Note that, in the attached claims, the spacer 120A is referred to as the "first spacer", the spacer 112 is referred to as the "second spacer", and the spacer 114 is referred to as the "third spacer." The term "another sidewall spacer" refers to any spacer other than the "first spacer" (120A) and does not exclude the spacers 112, 114.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor device, comprising:

a semiconductor substrate;

a fin defined in said semiconductor substrate;

a gate structure positioned around a portion of said fin;

epitaxial semiconductor material positioned on said fin in a source/drain region of said transistor device, said epitaxial semiconductor material having a plurality of lower angled surfaces; and a first sidewall spacer positioned adjacent said gate structure, wherein a first portion of said first sidewall spacer is also positioned on and in physical contact with at least a portion of said lower angled surfaces of said epitaxial semiconductor material, wherein said transistor device has a gate length that extends in a gate length direction and said epitaxial semiconductor material comprises a lower portion and an upper portion, wherein, in a direction corresponding to said gate length direction, said lower portion has a first dimension and said upper portion has a second dimension that is less than said first dimension, wherein a first surface of said first sidewall spacer is positioned on and in physical contact with an upper surface of said lower portion and an outer surface of said first sidewall spacer is positioned on and in physical contact with an end surface of said upper portion, wherein said fin further comprises opposing lateral fin sidewalls and wherein said transistor device further comprises:

a second sidewall spacer positioned on and in physical contact with said gate structure and on and in physical contact with said opposing lateral fin sidewalls; and a third sidewall spacer positioned on and in physical contact with said second sidewall spacer, wherein a second portion of said first sidewall spacer is positioned on and in physical contact with said third sidewall spacer.

2. The transistor device of claim 1, wherein said epitaxial semiconductor material has an axial length in a direction corresponding to said gate length direction, and wherein said first portion of said first sidewall spacer contacts said lower angled surfaces of said epitaxial semiconductor material for substantially the entire axial length of said epitaxial semiconductor material.

3. The transistor device of claim 1, wherein the upper surface of said lower portion of said epitaxial semiconductor material is substantially planar horizontally oriented and wherein said first sidewall spacer is positioned on and in physical contact with said substantially planar horizontally oriented upper surface.

4. The transistor device of claim 1, further comprising an insulating material positioned adjacent said fin, said insulating material having an upper surface, wherein at least a portion of said epitaxial semiconductor material is positioned vertically above said upper surface of said insulating material and wherein a surface of said first sidewall spacer is positioned on and in physical contact with said upper surface of said insulating material.

5. The transistor device of claim 1, wherein said lower angled surfaces of said epitaxial semiconductor material collectively have a first surface area and wherein said first portion of said first sidewall spacer covers less than an entirety of said first surface area.

6. The transistor device of claim 1, further comprising an insulating material positioned adjacent said fin, wherein an upper surface of the insulating material is lower than an uppermost surface of the fin.

7. A transistor device, comprising:

a semiconductor substrate;

a fin defined in said semiconductor substrate;

a gate structure positioned around a portion of said fin;

epitaxial semiconductor material positioned on said fin in a source/drain region of said transistor device, said epitaxial semiconductor material having a plurality of lower angled surfaces; and a first sidewall spacer positioned adjacent said gate structure, wherein a first portion of said first sidewall spacer is also positioned on and in physical contact with at least a portion of said lower angled surfaces of said epitaxial semiconductor material, wherein said transistor device has a gate length that extends in a gate length direction and said epitaxial semiconductor material comprises a lower portion and an upper portion, wherein, in a direction corresponding to said gate length direction, said lower portion has a first dimension and said upper portion has a second dimension that is less than said first dimension, wherein a first surface of said first sidewall spacer is positioned on and in physical contact with an upper surface of said lower portion and an outer surface of said first sidewall spacer is positioned on and in physical contact with an end surface of said upper portion, wherein the transistor device further includes another sidewall spacer positioned between said gate structure and said first sidewall spacer, wherein a first surface of said lower portion is positioned on and in physical contact with an outer surface of said another sidewall spacer.

8. A transistor device, comprising:

a semiconductor substrate;

a fin defined in said semiconductor substrate;

a gate structure positioned around a portion of said fin, wherein, at a location under said gate structure said fin has a fin upper surface positioned at a first level;

epitaxial semiconductor material positioned on said fin in a source/drain region of said transistor device, wherein a lower portion of said epitaxial semiconductor material is positioned above a level corresponding to said first level and wherein said lower portion of said epitaxial semiconductor material comprises a plurality of lower surfaces; and a first sidewall spacer positioned adjacent said gate structure, wherein a first portion of said first sidewall spacer is also positioned on and in physical contact with at least a portion of said plurality of lower surfaces of said lower portion of said epitaxial semiconductor material, wherein said transistor device has a gate length that extends in a gate length direction, and said epitaxial semiconductor material further comprises an upper portion, wherein, in a direction corresponding to said gate length direction, said lower portion has a first dimension and said upper portion has a second dimension that is less than said first dimension, wherein a first surface of said first sidewall spacer is positioned on and in physical contact with an upper surface of said lower portion and an outer surface of said first sidewall spacer is positioned on and in physical contact with an end surface of said upper portion, wherein the transistor device further comprises another sidewall spacer positioned between said gate structure and said first sidewall spacer, wherein a first surface of said lower portion is positioned on and in physical contact with an outer surface of said another sidewall spacer.

9. The transistor device of claim 8, wherein said fin further comprises opposing lateral fin sidewalls and wherein said transistor device further another sidewall spacer comprises:

a second sidewall spacer positioned on and in physical contact with said gate structure and on and in physical contact with said opposing lateral fin sidewalls; and a third sidewall spacer positioned on and in physical contact with said second sidewall spacer, wherein a second portion of said first sidewall spacer is positioned on and in physical contact with said third sidewall spacer.

10. The transistor device of claim 9, further comprising an insulating material positioned adjacent said fin, said insulating material having an upper surface, wherein at least a part of said epitaxial semiconductor material is positioned vertically above said upper surface of said insulating material and wherein a surface of said first sidewall spacer, a surface of said second sidewall spacer and a surface of said third sidewall spacer are positioned on and in physical contact with said upper surface of said insulating material.

11. The transistor device of claim 8, wherein said epitaxial semiconductor material has an axial length in a direction corresponding to said gate length direction, and wherein said first portion of said first sidewall spacer contacts said lower surfaces of said lower portion of said epitaxial semiconductor material for substantially the entire axial length of said epitaxial semiconductor material.

12. The transistor device of claim 8, wherein the upper surface of said lower portion of said epitaxial semiconductor material is substantially planar horizontally oriented and wherein said first sidewall spacer is positioned on and in physical contact with said substantially planar horizontally oriented upper surface.

13. The transistor device of claim 8, wherein said lower surfaces of said first portion of said epitaxial semiconductor material collectively have a first surface area and wherein said first portion of said first sidewall spacer covers less than an entirety of said first surface area.

14. The transistor device of claim 8, further comprising an insulating material positioned adjacent said fin, wherein an upper surface of the insulating material is lower than an uppermost surface of the fin.

* * * * *